(12) United States Patent
Onda

(10) Patent No.: US 6,184,547 B1
(45) Date of Patent: Feb. 6, 2001

(54) FIELD EFFECT TRANSISTOR AND METHOD OF FABRICATING THE SAME

(75) Inventor: Kazuhiko Onda, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/396,400

(22) Filed: Sep. 15, 1999

Related U.S. Application Data

(62) Division of application No. 09/017,137, filed on Feb. 2, 1998.

(30) Foreign Application Priority Data

Feb. 5, 1997 (JP) .......................................................... 9-22989

(51) Int. Cl.[7] ............................................... H01L 31/0328

(52) U.S. Cl. ............................. 257/194; 257/192; 257/15; 257/18; 257/20

(58) Field of Search .................................. 257/192, 194, 257/15, 18, 20

(56) References Cited

U.S. PATENT DOCUMENTS

| | | | |
|---|---|---|---|
| 5,351,128 | * | 9/1994 | Goto et al. ............................ 257/192 |
| 5,686,740 | * | 11/1997 | Hida ..................................... 257/192 |
| 5,689,125 | * | 11/1997 | Vaccaro et al. ....................... 257/200 |
| 5,811,843 | * | 9/1998 | Yamamoto et al. .................. 257/194 |
| 5,907,164 | * | 5/1999 | Nakayama ............................ 257/192 |

FOREIGN PATENT DOCUMENTS

| | | |
|---|---|---|
| 55-95370 | 7/1980 | (JP) . |
| 59-181673 | 10/1984 | (JP) . |
| 61-100968 | 5/1986 | (JP) . |
| 62-73675 | 4/1987 | (JP) . |
| 1-179460 | 7/1989 | (JP) . |
| 2-234470 | 9/1990 | (JP) . |
| 4-159730 | 6/1992 | (JP) . |
| 4-180240 | 6/1992 | (JP) . |
| 4-233241 | 8/1992 | (JP) . |
| 5-129342 | 5/1993 | (JP) . |
| 6-84958 | 3/1994 | (JP) . |
| 6-177168 | 6/1994 | (JP) . |
| 6-232175 | 8/1994 | (JP) . |
| 6-236898 | 8/1994 | (JP) . |
| 6-275656 | 9/1994 | (JP) . |
| 6-302265 | 10/1994 | (JP) . |
| 7-38091 | 2/1995 | (JP) . |

(List continued on next page.)

OTHER PUBLICATIONS

K.H.G. Duh et al., IEEE Microwave and Guided Wave Letters, vol. 1, No. 5, "A Super Low–Noise 0.1 μm T–Gate InAlAs–IngaAs–InP HEMT", May 1991, pp. 114–116.

G.I. Ng. Dimitrios Pavlidis et al., IEEE Electron Device Letters, vol. 10, No. 3, "Improved Strained HEMT Characteristics Using Double–Heterojunction $In_{0.65}Ga_{0.35}As/In_{0.52}–Al_{0.48}As$ Design", Mar. 1989, pp. 114–116.

N. Hayafuji et al., Applied Physics Letters, vol. 66, No. 7, "Thermal Stability of AlInAs/GaInAs/InP Heterostructures", Feb. 1995, pp. 863–865.

(List continued on next page.)

Primary Examiner—Olik Chaudhuri
Assistant Examiner—Wai-Sing Louie
(74) Attorney, Agent, or Firm—Young & Thompson

(57) ABSTRACT

There is provided a field effect transistor including a semi-insulating semiconductor substrate formed with a recess at a region in which a gate is to be formed, a gate base layer formed on the recess and composed of one of an InP layer and a plurality of layers including an InP layer, and a gate electrode formed on the gate base layer. The InP layer may be replaced with an InGaP layer, an $Al_xGa_{1-x}As$ ($0 \leq X \leq 1$) layer, an $In_xGa_{1-x}As$ ($0 \leq X \leq 1$) layer, or an $In_xAl_{1-x}As$ ($0 \leq X < 0.4$ or $0.6 < X \leq 1$) layer. The above-mentioned field effect transistor prevents thermal instability thereof caused by impurities such as fluorine entering a donor layer to thereby inactivate donor. As a result, there is presented a highly reliable compound field effect transistor.

15 Claims, 9 Drawing Sheets

FOREIGN PATENT DOCUMENTS

| | | |
|---|---|---|
| 7-111327 | 4/1995 | (JP) . |
| 7-142513 | 6/1995 | (JP) . |
| 7-161971 | 6/1995 | (JP) . |
| 7-312421 | 11/1995 | (JP) . |
| 8-115925 | 5/1996 | (JP) . |

OTHER PUBLICATIONS

N. Takahashi et al., Proceedings of 7th International Conference of InP and Related Materials, "Thermal Stability of $Al_{0.48}In_{0.52}As/Ga_{0.47}In_{0.53}As/InP$ Heterostructure and Its Improvement by Phosphidization", 1995, pp. 597–600.

A. Fujihara et al., Technical Report of IEICE, "Thermal Stability of InAlAs InGaAs HJFETs with an In $(Al_{1-x}Ga_x)As$ Layer", pp. 13–20.

A. Fujihara et al., Electronic Letters, vol. 32, No. 11, "Thermally Stable InAlAs/InGaAs Heterojunction FET with AiAs/InAs Superlattice Insertion Layer", May 23, 1996, pp. 1039–10041.

T. Enoki et al., Proceedings of 7th International Conference of InP and Related Materials, "0.1$\mu$m InAlAs/InGaAs HEMTS with an InP–Recess–Etch Stopper Grown by MOCVD", 1995, pp. 81–84.

A. Mesquida Kusters et al. IEEE Electron Device Letters, vol. 16, No. 9, "Sub–Half–Micrometer Pseudomorphic InP/$In_xGa_{1-x}As$/InP HEMT's ($0.74 \leq x \leq 0.81$) with Very High $f_T$ Values", Sep. 1995, pp. 396–398.

A. Mesquida Kusters et al., IEEE Electron Device Letters, vol. 14, No. 1, "Double–Heterjunction Lattice–Matched and Pseudomorphic InGaAs HEMT with $\delta$–Doped InP Supply Layers and p–InP Barier Enhancement Layer Grown by LP–MOVPE", Jan. 1993, pp. 36–39.

\* cited by examiner

FIELD EFFECT TRANSISTOR AND METHOD OF FABRICATING THE SAME

CROSS-REFERENCE TO RELATED APPLICATIONS

This application is a division of copending application Ser. No. 09/017,137, filed Feb. 2, 1998.

BACKGROUND OF THE INVENTION

1. Field of the Invention

The invention relates to a field effect transistor and a method of fabricating the same, and more particularly to a field effect transistor as a highly reliable, high-performance chemical compound electronic device operating in a range of microwaves and millimeter waves, and a method of fabricating the same.

2. Description of the Related Art

In these days, ternary and quaternary mixed crystal semiconductor such as InGaAs and InGaAsP have attracted attention. Among them, InGaAs matching in lattice to an InP substrate is in particular suitable to optical devices and material of which field effect transistors are made. In particular, a field effect transistor employing two-dimensional electron gas at a hetero-interface between InP and InAlAs has been much studied. The reasons why InGaAs is promising as an electron transfer device in comparison with GaAs and so on are as follows:

(a) a peak value at electron drift velocity is greater;
(b) mobility of an electron at a low intensity electric field is greater;
(c) it is easier to form ohmic electrodes with the result of smaller contact resistance;
(d) greater overshoot in an electron speed can be expected;
(e) smaller noise caused by root scattering; and
(f) better characteristics with respect to an interface with insulating materials.

In addition, it is one of major reasons to be able to accomplish a two-dimensional electron gas device.

A field effect transistor employing two-dimensional electron gas at an interface between InGaAs and InAlAs is presently considered promising as a high performance microwave milliwave device, and is researched and developed. In particular, the above-mentioned field effect transistor has been confirmed to be effective as a low-noise device in experiments. For instance, as reported by K. H. G. Duh et al. in "A Super Low-Noise 0.1 µm T-Gate InAlAs-InGaAs-InP HEMT", IEEE MICROWAVE AND GUIDED WAVE LETTERS. Vol. 1, No. 5, May 1991, pp. 114–116, noise figure of 1.2 dB and associated gain of 7.2 dB at 94 GHz in room temperature have been confirmed. The device having been reported by Duh was made of material accomplishing lattice match on an InP substrate, that is, $In_{0.53}Ga_{0.47}As/In_{0.52}Al_{0.48}As$, and material defining In composition. In the device, two-dimensional electron gas is formed in the $In_{0.53}Ga_{0.47}As$ layer.

In order to enhance performance of the device, for instance, an attempt was made by G. I. NG et al. in "Improved Strained HEMT Characteristics Using Double-Heterojunction $In_{0.65}Ga_{0.35}As/In_{0.52}Al_{0.48}As$ Design", IEEE ELECTRON DEVICE LETTERS, Vol. 10, No. 3, March 1989, pp. 114–116, where In composition in an InGaAs layer constituting a channel was arranged to have a figure greater than 0.53.

Recently, various high performances of a device have been reported in the field of InAlAs/InGaAs family heterojunction field effect transistor. On the other hand, thermally unstable factors have been also reported. That is, impurities such as fluorine which is not a constituent of a device enter an epitaxial layer from outside to thereby inactivate donor in an impurity containing InAlAs layer usually used as a donor layer.

For instance, Hayafuji has reported degradation of a device caused by fluorine in "Thermal stability of AlInAs/GaInAs/InP heterostructure", Applied Physics Letters, Vol. 66, No. 7, February 1995, pp. 863–865. For another instance, Takahashi has reported degradation of a device caused by oxygen in "Thermal Stability of $Al_{0.48}In_{0.52}As/Ga_{0.47}In_{0.53}As/InP$ Heterostructure and its Improvement by Phosphidization", Proceedings of 7th International Conference of InP and Related Materials, 1995, pp. 597–600.

Fujihara et al. reported in Technical Report of IEICE ED95-105, pp. 13–20 that impurities entering an epitaxial layer are reduced in an amount by decreasing a composition rate of Al in an InAlAs Schottky layer formed on an InAlAs donor layer. That is, when a donor layer is composed of InAlAs, the thermal instability may be eliminated by forming a barrier layer on the donor layer for preventing impurities from entering to the donor layer. Fujihara reported conducting experiment in which there were formed samples of InAlGaAs Schottky layers containing no impurities and having different composition rates between Al and Ga, and the samples stood in heated condition. The result of the experiment was that as a composition rate of Al was decreased, fluorine entering an epitaxial layer was reduced in an amount, and further a reduction of a sheet electron density was stopped.

As an example for enhancing reliability of a device in a similar manner, Fujihara et al. suggested a field effect transistor in "Thermally stable InAlAs/InGaAs heterojunction FET with AlAs/InAs superlattice insertion layer", ELECTRONICS LETTERS, 23rd May 1996, Vol. 32, No. 11, pp. 1039–1041. In the suggested field effect transistor, a superlattice layer composed of AlAs and InAs is inserted between a donor layer and a gate forming layer. It is reported that the field effect transistor can prevent intrusion of fluorine thereinto, and stop thermal degradation.

As an example of an InP layer used as a barrier layer, Enoki et al. has suggested a structure in "0.1-µm InAlAs/InGaAs HEMTS WITH AN InP-RECESS-ETCH STOPPER GROWN BY MOCVD", Proceedings of 7th International Conference of InP and Related Materials, 1995, pp. 81–84. It is reported that an InP layer as a gate contact layer is formed on an InAlAs layer to thereby enhance uniformity of device characteristics in a wafer.

As mentioned above, when a donor layer is composed of InAlAs, inactivation of donor caused by intrusion of impurities thereinto is a major problem significantly reducing reliability of a device. In most of heterojunction field effect transistors to be formed on an InP substrate, a donor source layer is generally composed of an InAlAs layer. To the contrary, a transistor which does not employ InAlAs, but employs InP for a donor layer has been suggested by A. M. Küsters et al. in IEEE ELECTRON DEVICE LETTERS, Vol. 16, No. 9, 1995, pp. 396–398. The suggested transistor avoids inactivation of donor caused by intrusion of impurities such as fluorine by not employing InAlAs for a donor source layer, to thereby ensure thermal reliability.

As mentioned earlier, a major problem for reducing reliability in an InAlAs/InGaAs heterojunction transistor is that impurities such as fluorine present in an atmosphere or fluorine adhered to a surface of a sample in a process enters an epitaxial layer while a device is held in heated condition, resulting in that donor in an InAlAs layer containing n-type impurities therein is inactivated.

One of objects of the present invention is to solve this problem by providing a highly reliable high performance InAlAs/InGaAs family heterojunction transistor. One of solutions to the problem is to insert a barrier layer between an InAlAs donor layer and a gate electrode for preventing intrusion of impurities into an epitaxial layer. Up to now, it has been found out by experiments that intrusion of impurities into an epitaxial layer can be prevented by employing material other than InAlAs and AlGaAs, as having been reported by Hayafuji, Fujihara and Enoki.

However, the use of a barrier layer is accompanied with other problems. If a barrier layer had positive conduction band discontinuity to material of which a cap layer is composed, since an ohmic electrode is formed on the barrier layer, a source resistance would be increased with the result of deterioration of performance of a device. Since a cap layer is usually composed of InGaAs, the barrier layers employed in the above-mentioned prior art are accompanied with another problem of an increased source resistance.

In addition, since crystal quality of a barrier layer exerts a major influence on crystal quality of a layer to be formed on the barrier layer, it would be absolutely necessary to determine crystal growth conditions each time when a device is fabricated.

Apart from the above-mentioned prior art, various InAlAs/InGaAs family heterojunction transistors have been suggested as follows.

In "Double-Heterojunction Lattice-Matched and Pseudomorphic InGaAs HEMT with δ-Doped InP Supply Layers and p-InP Barrier Enhancement Layer Grown by LP-MOVPE", IEEE ELECTRON DEVICE LETTERS, Vol. 14, No. 1, January 1993, A. M. Küsters et al. have suggested a LP-MOVPE-grown double-heterojunction HEMT (DH-MEMT) with InP as carrier-supplying and barrier layers that avoid the kink effect due to Al-containing layers.

Japanese Unexamined Patent Publication No. 4-180240 has suggested a field effect transistor including an InP substrate and an InGaAs layer formed on the InP substrate, wherein the InGaAs layer has an In composition rate greater than 0.53 at which the InGaAs layer is lattice-matched with the InP substrate.

Japanese Unexamined Patent Publication No. 6-232175 has suggested $In_XAl_{1-X}As/In_YGa_{1-Y}As$ heterojunction type field effect transistor lattice-matched with an InP substrate, wherein pseudo-morphic undoped $Al_ZGa_{1-Z}As$ layer is inserted below a gate electrode, and an n-type GaAs layer is formed on the undoped $Al_ZGa_{1-Z}As$ layer in source/drain regions.

Japanese Unexamined Patent Publication No. 6-236898 has suggested a field effect transistor, in which an I-type $In_{0.52}Al_{0.48}As$ buffer layer, an I-type $In_{1-X}Ga_XAs_YP_{1-Y}$ channel layer, an $In_{0.52}Al_{0.48}As$ spacer layer, an n-type $In_{0.52}Al_{0.48}As$ electron supply layer, an I-type $In_{0.52}Al_{0.48}As$ Schottky layer, and n-type $In_{0.53}Ga_{0.47}As$ cap layer are grown on a semi-insulating InP substrate. A gate electrode is formed on a recess formed in the n-type $In_{0.53}Ga_{0.47}As$ cap layer, and source and drain electrodes are formed at opposite sides of the gate electrode.

Japanese Unexamined Patent Publication No. 6-302625 has suggested a field effect transistor including n-$In_{0.49}Ga_{0.51}P$ etching stopper layer, n-$Al_XGa_{1-X}As$ layer, and a GaAs cap layer on an operation layer. A gate electrode is formed on the n-$In_{0.49}Ga_{0.51}P$ etching stopper layer.

Japanese Unexamined Patent Publication No. 7-111327 has suggested a heterojunction field effect transistor wherein a non-doped $In_{0.52}Al_{0.48}As$ buffer layer, a non-doped $In_{0.80}Ga_{0.20}As$ channel layer, a non-doped $In_{0.52}Al_{0.48}As$ spacer layer, an n-type $In_{0.52}Al_{0.48}As$ doped layer, a non-doped $In_{0.52}Al_{0.48}As$ gate contact layer, a non-doped $In_{0.80}Ga_{0.20}As$ resistance reducing layer, and an n-type $In_{0.53}Ga_{0.47}As$ cap layer are formed in this order on a semi-insulating InP substrate. The field effect transistor is characterized by the non-doped $In_{0.80}Ga_{0.20}AS$ inserted between the non-doped $In_{0.52}Al_{0.48}As$ gate contact layer and the n-type $In_{0.53}Al_{0.47}As$ cap layer.

Japanese Unexamined Patent Publication No. 7-312421 has suggested a field effect transistor wherein an InGaAs active layer, an InAlAs layer, a GaAs layer, and an InGaAs cap layer are formed on an InP substrate. A gate electrode is formed on the GaAs layer. A layer made of metal having a melting point at 1600° C. or greater is sandwiched between the gate electrode and the GaAs layer. N-type impurities are implanted into a part of the InAlAs layer.

SUMMARY OF THE INVENTION

It is an object of the present invention to provide a field effect transistor as a microwave milliwave compound device capable of avoiding thermal instability caused by impurities entering a donor layer to thereby cause donor to be inactivated, and also provide a method of fabricating the same.

In one aspect of the present invention, there is provided a field effect transistor including (a) a semi-insulating semiconductor substrate formed with a recess at a region in which a gate is to be formed, (b) a gate base layer formed on the recess and composed of one of an InP layer and a plurality of layers including an InP layer, and (c) a gate electrode formed on the gate base layer.

There is further provided a field effect transistor including (a) a semi-insulating semiconductor substrate formed with a recess at a region in which a gate is to be formed, (b) a gate base layer formed on the recess and composed of one of an InGaP layer and a plurality of layers including an InGaP layer, and (c) a gate electrode formed on the gate base layer.

There is still further provided a field effect transistor including (a) a semi-insulating semiconductor substrate formed with a recess at a region in which a gate is to be formed, (b) a gate base layer formed on the recess and composed of one of an $Al_XGa_{1-X}As$ ($0 \leq X \leq 1$) layer and a plurality of layers including an $Al_XGa_{1-X}As$ ($0 \leq X \leq 1$) layer, and (c) a gate electrode formed on the gate base layer.

There is yet further provided a field effect transistor including (a) a semi-insulating semiconductor substrate formed with a recess at a region in which a gate is to be formed, (b) a gate base layer formed on the recess and composed of one of an $In_XGa_{1-X}As$ ($0 \leq X \leq 1$) layer and a plurality of layers including an $In_XGa_{1-X}As$ ($0 \leq X \leq 1$) layer, and (c) a gate electrode formed on the gate base layer.

There is still yet further provided a field effect transistor including (a) a semi-insulating semiconductor substrate formed with a recess at a region in which a gate is to be formed, (b) a gate base layer formed on the recess and composed of one of an $In_XAl_{1-X}As$ ($0 \leq X \leq 0.4$ or $0.6 < X \leq 1$) layer and a plurality of layers including an $In_XAl_{1-X}As$ ($0 \leq X < 0.4$ or $0.6 < X \leq 1$) layer, and (c) a gate electrode formed on the gate base layer.

The above-mentioned field effect transistor may further include an InAlAs or AlGaAs layer containing no impurities therein, formed between the gate base layer and the gate electrode. For instance, the semi-insulating semiconductor substrate may be composed of GaAs or InP.

In another aspect of the present invention, there is provided a method of fabricating a field effect transistor, including the steps of (a) forming a recess with a semi-insulating semiconductor substrate at a region in which a gate is to be formed, (b) forming a gate base layer on the recess, the gate base layer being composed of one of an InP layer and a plurality of layers including an InP layer, and (c) forming a gate electrode on the gate base layer.

There is further provided a method of fabricating a field effect transistor, including the steps of (a) forming a recess with a semi-insulating semiconductor substrate at a region in which a gate is to be formed, (b) forming a gate base layer on the recess, the gate base layer being composed of one of an InGaP layer and a plurality of layers including an InGaP layer, and (c) forming a gate electrode on the gate base layer.

There is still further provided a method of fabricating a field effect transistor, including the steps of (a) forming a recess with a semi-insulating semiconductor substrate at a region in which a gate is to be formed, (b) forming a gate base layer on the recess, the gate base layer being composed of one of an $Al_xGa_{1-x}As$ ($0 \leq X \leq 1$) layer and a plurality of layers including an $Al_xGa_{1-x}As$ ($0 \leq X \leq 1$) layer, and (c) forming a gate electrode on the gate base layer.

There is yet further provided a method of fabricating a field effect transistor, including the steps of (a) forming a recess with a semi-insulating semiconductor substrate at a region in which a gate is to be formed, (b) forming a gate base layer on the recess, the gate base layer being composed of one of an $In_xGa_{1-x}As$ ($0 \leq X \leq 1$) layer and a plurality of layers including an $In_xGa_{1-x}As$ ($0 \leq X \leq 1$) layer, and (c) forming a gate electrode on the gate base layer.

There is still yet further provided a method of fabricating a field effect transistor, including the steps of (a) forming a recess with a semi-insulating semiconductor substrate at a region in which a gate is to be formed, (b) forming a gate base layer on the recess, the gate base layer being composed of one of an $In_xAl_{1-x}As$ ($0 \leq X < 0.4$ or $0.6 < X \leq 1$) layer and a plurality of layers including an $In_xAl_{1-x}As$ ($0 \leq X < 0.4$ or $0.6 < X \leq 1$) layer, and (c) forming a gate electrode on the gate base layer.

The above-mentioned method may further include the step (d) of forming an InAlAs or AlGaAs layer containing no impurities therein, between the gate base layer and the gate electrode, the step (d) being to be carried out between the steps (b) and (c).

One of keys of the present invention is to form a barrier layer below a gate electrode. The barrier layer is composed of material which does not allow impurities to pass therethrough in order to prevent InAlAs and AlGaAs layers, to which n-type impurities are implanted and which are readily contaminated with impurities such as fluorine, from being exposed outside. However, when the InAlAs and AlGaAs layers are crystal-grown in usual planar state, the formation of a barrier layer below a gate electrode may be accompanied with problems such as an increase of a source resistance and gate leakage. In addition, if a barrier layer is formed directly below a gate electrode, crystal growth conditions have to be determined in detail and/or a barrier layer may have a thickness limitation in order to avoid degradation in quality of a cap layer to be formed on a barrier layer. Hence, in accordance with the present invention, a recess is first formed, then a barrier layer and a gate contact layer are selectively grown within the recess, and finally a gate electrode is formed on the barrier layer.

The field effect transistor in accordance with the present invention prevents thermal instability thereof caused by impurities such as fluorine entering a donor layer to thereby inactivate donor. As a result, there is presented a highly reliable compound field effect transistor to be formed on an InP substrate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1A:
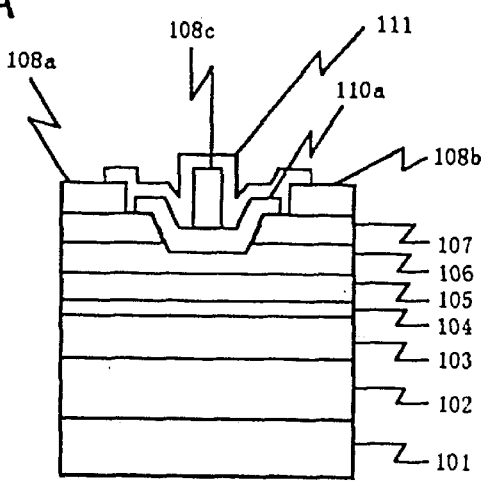
FIG. 1A is a cross-sectional view of a field effect transistor in accordance with the first embodiment of the present invention.

FIG. 1A illustrates a field effect transistor in accordance with the first embodiment of the present invention. The illustrated field effect transistor includes a semi-insulating InP substrate 101, and an epitaxial-layered structure formed on the InP substrate 101. The epitaxial-layered structure is comprised of an InAlAs layer 102 containing no impurities therein and having a thickness of 20 nm, an InGaAs layer 103 containing no impurities therein and having a thickness of 20 nm, an InAlAs layer 104 containing no impurities therein and having a thickness of 5 nm, an InAlAs layer 105 implanted at a dose of $3\times10^{18}$ cm$^{-3}$ and having a thickness of 150 nm, an InAlAs layer 106 containing no impurities therein and having a thickness of 20 nm, and an InGaAs layer 107 implanted at a dose of $3\times10^{18}$ cm$^{-3}$ silicon and having a thickness of 20 nm, all of which are deposited one on another in this order.

Ohmic electrodes 108a and 108b as source and drain electrodes are formed on the uppermost layer or InGaAs layer 107. The ohmic electrodes 108a and 108b are composed of alloy of AuGe, Ni and Au. By thermal annealing, these alloy layers reach the InGaAs layer 103 corresponding to a channel.

Between the ohmic electrodes 108a and 108b is formed a recess which reaches an intermediate depth of the InAlAs layer 106. The recess is covered with an InP layer 110a containing no impurities and having a thickness of 10 nm. A gate electrode 108c is formed on the InP layer 110a. The gate electrode 108c has a multi-layered structure including Ti, Pt and Au layers deposited one on another in this order, and has a gate length of 1 μm.

The gate electrode 108c and the InP layer 110a are entirely covered with a protection film 111 composed of SiN and deposited by plasma-enhanced chemical vapor deposition (PECVD).

In the illustrated field effect transistor in accordance with the first embodiment, a mutual conductance of 500 mS/mm was obtained as device initial characteristics. In addition, there were also obtained Schottky barrier height of 0.5 eV and a gate inverse breakdown voltage of 7V.

[Second Embodiment]

Figure 1B:
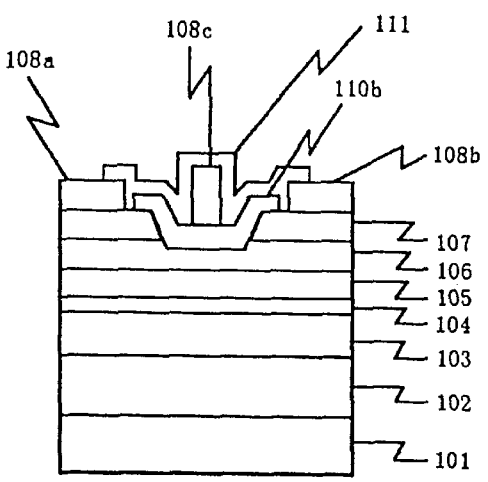
FIG. 1B is a cross-sectional view of a field effect transistor in accordance with the second embodiment of the present invention.

FIG. 1B illustrates a field effect transistor in accordance with the second embodiment. In the illustrated field effect transistor, an InGaP layer 110b containing no impurities is formed in place of the InP layer 110a in the first embodiment, illustrated in FIG. 1A. The field effect transistor in accordance with the second embodiment provides the same advantages as those of the field effect transistor in accordance with the first embodiment.

In the illustrated field effect transistor in accordance with the second embodiment, a mutual conductance of 490 mS/mm was obtained as device initial characteristics. In addition, there were also obtained Schottky barrier height of 0.5 eV and a gate inverse breakdown voltage of 7V.

[Third Embodiment]

Figure 1C:
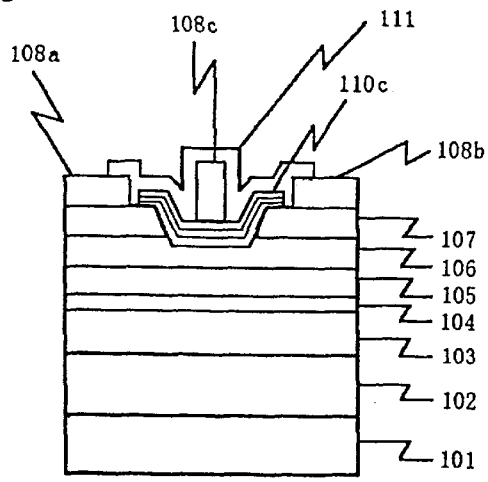
FIG. 1C is a cross-sectional view of a field effect transistor in accordance with the third embodiment of the present invention.

FIG. 1C illustrates a field effect transistor in accordance with the third embodiment. In the illustrated field effect transistor, a superlattice layer 110c composed of AlAs and InAs and containing no impurities is formed in place of the InP layer 110a in the first embodiment, illustrated in FIG. 1A. The superlattice layer 110c has a four-cycled multi-layered structure including four AlAs atom layers and four InAs atom layers deposited one on another. The field effect transistor in accordance with the third embodiment provides the same advantages as those of the field effect transistor in accordance with the first embodiment.

In the illustrated field effect transistor in accordance with the second embodiment, a mutual conductance of 510 mS/mm was obtained as device initial characteristics. In addition, there were also obtained Schottky barrier height of 0.5 eV and a gate inverse breakdown voltage of 6V.

Figure 2A:
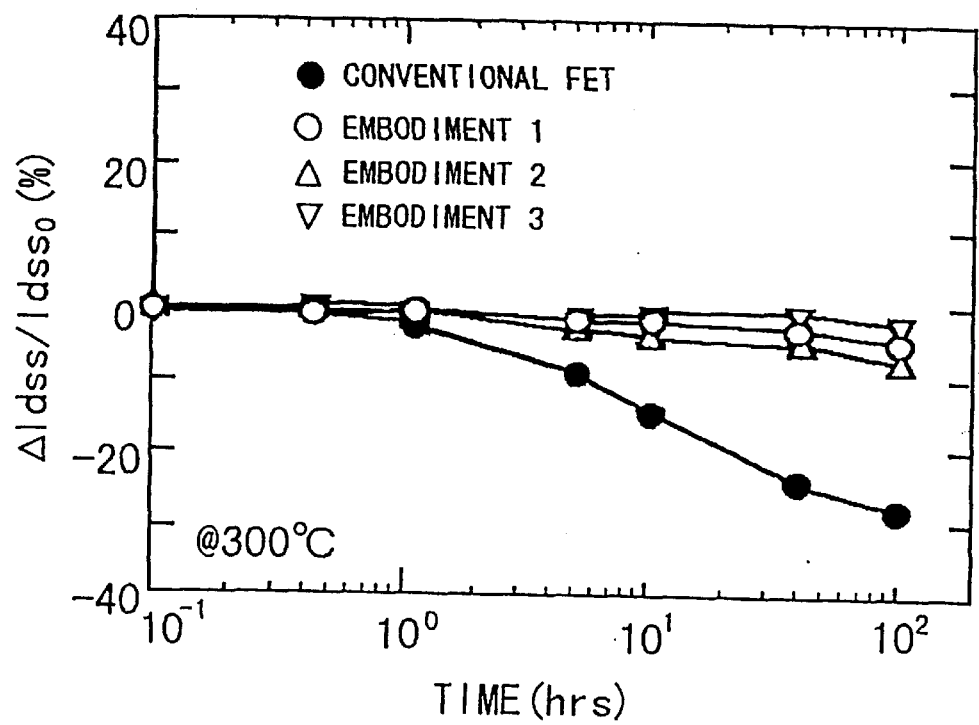
FIG. 2A is a graph showing thermal fluctuation in a drain current in a storage test in heated condition in field effect transistors in accordance with the first, second and third embodiments.
Figure 2B:
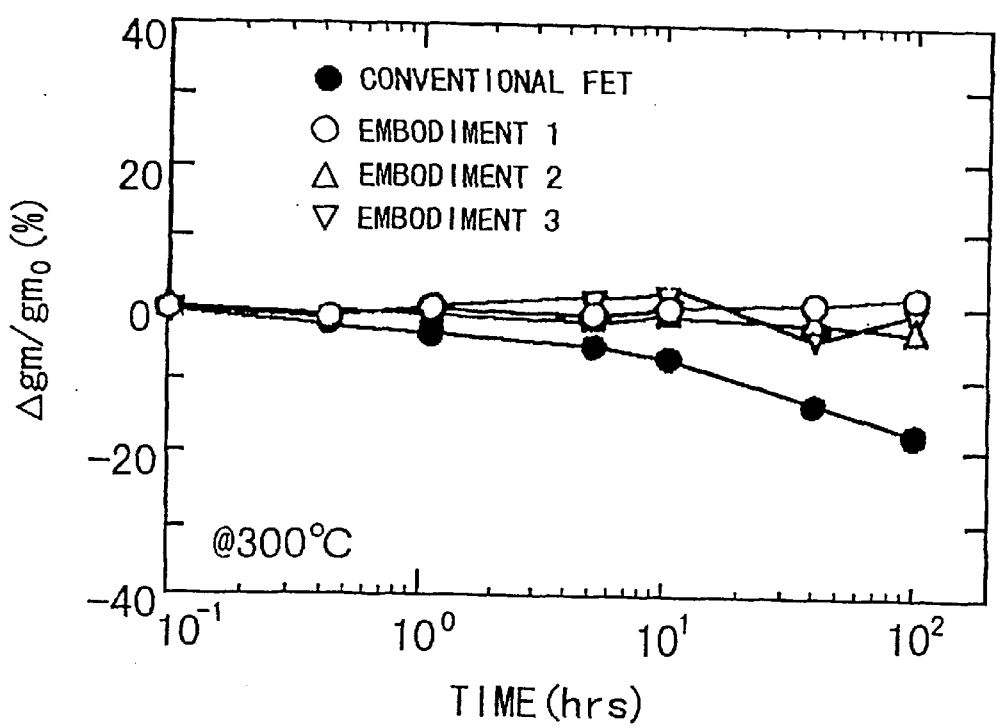
FIG. 2B is a graph showing thermal fluctuation in a mutual conductance in a storage test in heated condition in field effect transistors in accordance with the first, second and third embodiments.

FIGS. 2A and 2B show a drain current and a mutual conductance both obtained when a storage test in heated condition was conducted to the field effect transistors in accordance with the above-mentioned first to third embodiments, respectively. As mentioned later in detail, the field effect transistors in accordance with the above-mentioned first to third embodiments show less degradation both in a drain current and a mutual conductance than a conventional field effect transistor represented with solid circles (æ).

[Fourth Embodiment]

Figure 3A:
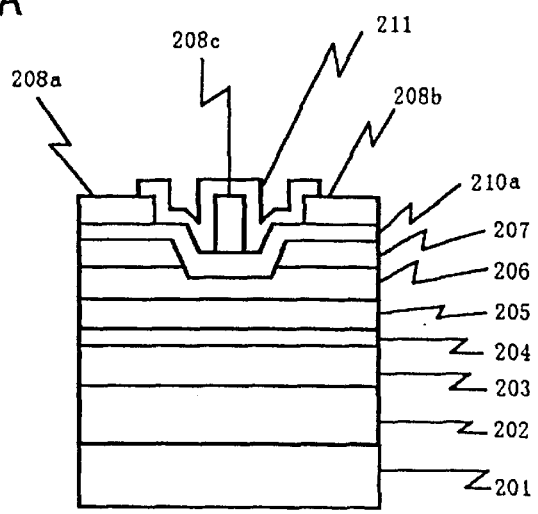
FIG. 3A is a cross-sectional view of a field effect transistor in accordance with the fourth embodiment of the present invention.

FIG. 3A illustrates a field effect transistor in accordance with the fourth embodiment of the present invention. The illustrated field effect transistor includes a semi-insulating InP substrate 201, and an epitaxial-layered structure formed on the InP substrate 201. The epitaxial-layered structure is comprised of an InAlAs layer 202 containing no impurities therein and having a thickness of 500 nm, an InGaAs layer 203 containing no impurities therein and having a thickness of 20 nm, an InAlAs layer 204 containing no impurities therein and having a thickness of 5 nm, an InAlAs layer 205 implanted at a dose of $3\times10^{18}$ cm$^{-3}$ silicon and having a thickness of 150 nm, an InAlAs layer 206 containing no impurities therein and having a thickness of 20 nm, and an InGaAs layer 207 implanted at a dose of $3\times10^{18}$ cm$^{-3}$ silicon and having a thickness of 20 nm, all of which are deposited one on another in this order.

The epitaxial-layered structure is formed at an upper surface thereof with a recess which reaches an intermediate depth of the InAlAs layer 206. The recess is covered with an InP layer 210a containing no impurities and having a thickness of 10 nm. A gate electrode 208c is formed on the InP layer 210a. The gate electrode 208c has a multi-layered structure including Ti, Pt and Au layers deposited one on another in this order, and has a gate length of 1 μm.

Ohmic electrodes 208a and 208b as source and drain electrodes are formed on the InP layer 210a. The ohmic electrodes 208a and 208b are composed of alloy of AuGe, Ni and Au. By thermal annealing, these alloy layers reach the InGaAs layer 203 corresponding to a channel.

The gate electrode 208c and the InP layer 210a are entirely covered with a protection film 211 composed of SiN and deposited by PECVD.

In the illustrated field effect transistor in accordance with the fourth embodiment, a mutual conductance of 500 mS/mm was obtained as device initial characteristics. In addition, there were also obtained Schottky barrier height of 0.6 eV and a gate inverse breakdown voltage of 7V.

[Fifth Embodiment]

Figure 3B:
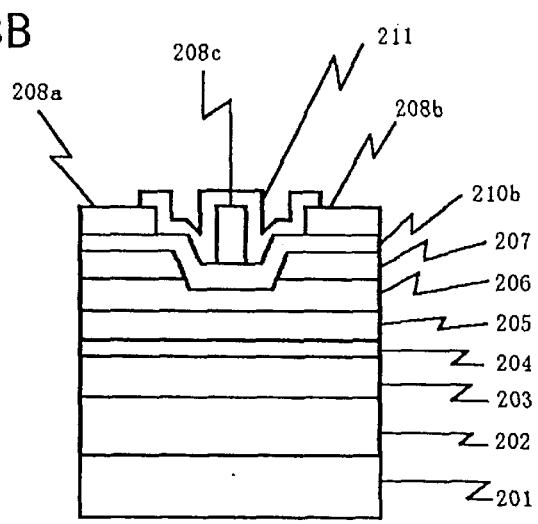
FIG. 3B is a cross-sectional view of a field effect transistor in accordance with the fifth embodiment of the present invention.

FIG. 3B illustrates a field effect transistor in accordance with the fifth embodiment. In the illustrated field effect transistor, an InGaP layer 210b containing no impurities is formed in place of the InP layer 210a in the fourth embodiment, illustrated in FIG. 3A. The field effect transistor in accordance with the fifth embodiment provides the same advantages as those of the field effect transistor in accordance with the fourth embodiment.

In the illustrated field effect transistor in accordance with the fifth embodiment, a mutual conductance of 510 mS/mm was obtained as device initial characteristics. In addition, there were also obtained Schottky barrier height of 0.65 eV and a gate inverse breakdown voltage of 6.5V.

[Sixth Embodiment]

Figure 3C:
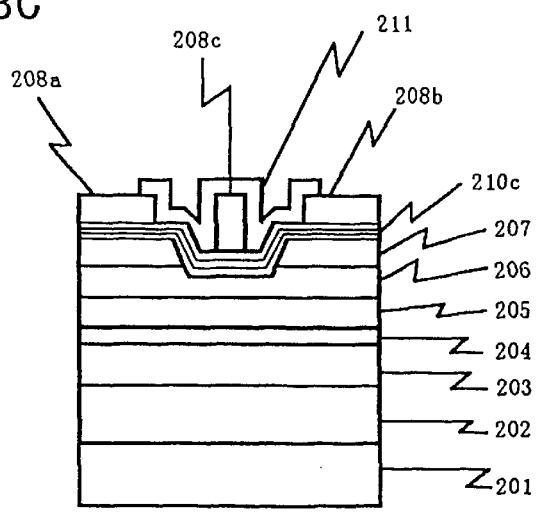
FIG. 3C is a cross-sectional view of a field effect transistor in accordance with the sixth embodiment of the present invention.

FIG. 3C illustrates a field effect transistor in accordance with the sixth embodiment. In the illustrated field effect transistor, a superlattice layer 210c composed of AlAs and InAs and containing no impurities is formed in place of the InP layer 210a in the fourth embodiment, illustrated in FIG. 3A. The superlattice layer 210c has a four-cycled multi-layered structure including four AlAs atom layers and four InAs atom layers deposited one on another. The field effect transistor in accordance with the sixth embodiment provides the same advantages as those of the field effect transistor in accordance with the fourth embodiment.

In the illustrated field effect transistor in accordance with the sixth embodiment, a mutual conductance of 540 mS/mm was obtained as device initial characteristics. In addition, there were also obtained Schottky barrier height of 0.65 eV and a gate inverse breakdown voltage of 6V.

Figure 4A:
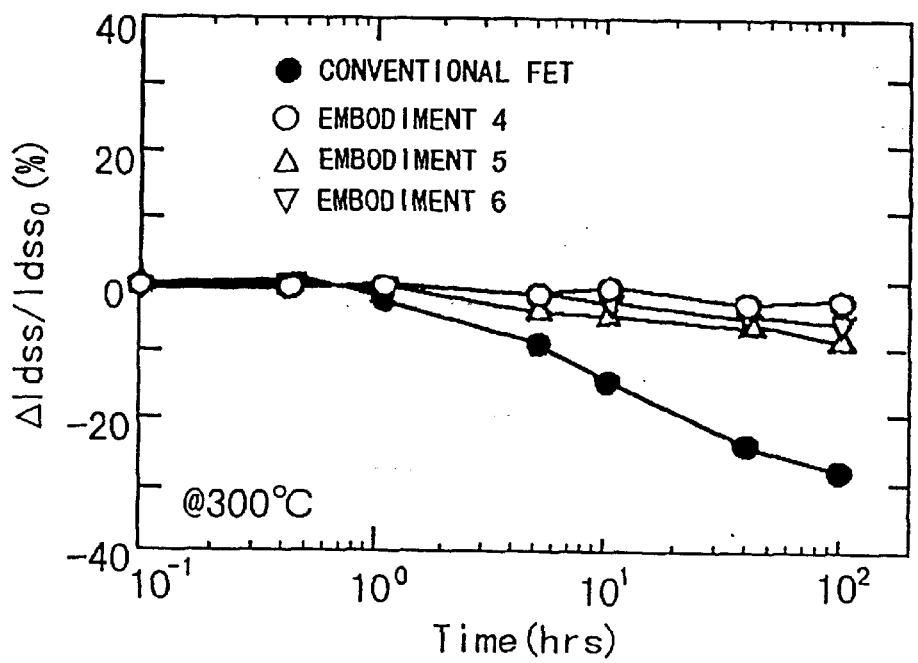
FIG. 4A is a graph showing thermal fluctuation in a drain current in a storage test in heated condition in field effect transistors in accordance with the fourth, fifth and sixth embodiments.
Figure 4B:
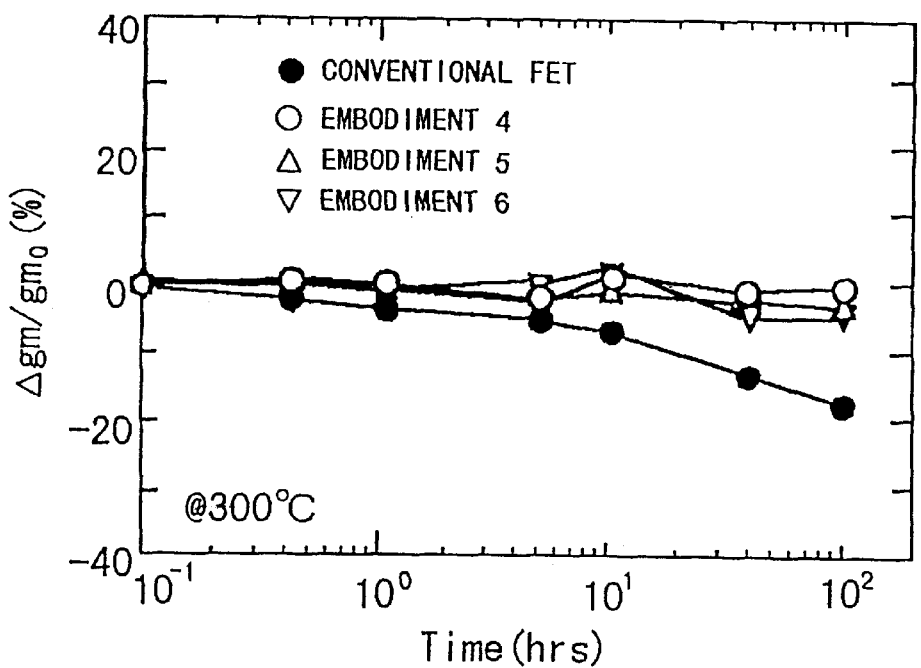
FIG. 4B is a graph showing thermal fluctuation in a mutual conductance in a storage test in heated condition in field effect transistors in accordance with the fourth, fifth and sixth embodiments.

FIGS. 4A and 4B show a drain current and a mutual conductance both obtained when a storage test in heated condition was conducted to the field effect transistors in accordance with the above-mentioned fourth to sixth embodiments, respectively. As mentioned later in detail, the field effect transistors in accordance with the above-mentioned fourth to sixth embodiments show less degradation both in a drain current and a mutual conductance than a conventional field effect transistor represented with solid circles (●).

[Seventh Embodiment]

Figure 5A:
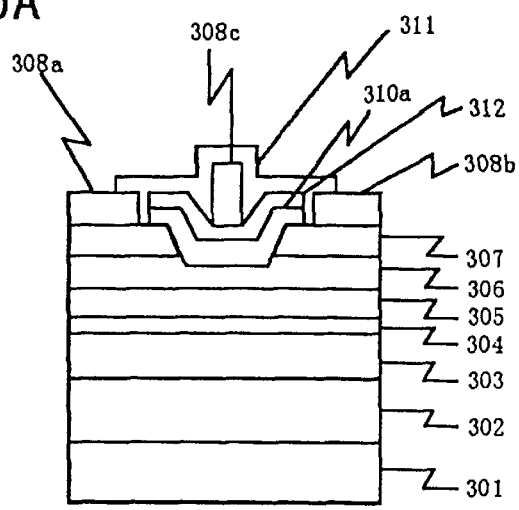
FIG. 5A is a cross-sectional view of a field effect transistor in accordance with the seventh embodiment of the present invention.

FIG. 5A illustrates a field effect transistor in accordance with the seventh embodiment of the present invention. The illustrated field effect transistor includes a semi-insulating InP substrate 301, and an epitaxial-layered structure formed on the InP substrate 301. The epitaxial-layered structure is comprised of an InAlAs layer 302 containing no impurities therein and having a thickness of 500 nm, an InGaAs layer 303 containing no impurities therein and having a thickness of 20 nm, an InAlAs layer 304 containing no impurities therein and having a thickness of 5 nm, an InAlAs layer 305 implanted at a dose of $3 \times 10^{18}$ cm$^{-3}$ silicon and having a thickness of 150 nm, an InAlAs layer 306 containing no impurities therein and having a thickness of 20 nm, and an InGaAs layer 307 implanted at a dose of $3 \times 10^{18}$ cm$^{-3}$ silicon and having a thickness of 20 nm, all of which are deposited one on another in this order.

Ohmic electrodes 308a and 308b as source and drain electrodes are formed on the uppermost layer or InGaAs layer 307. The ohmic electrodes 308a and 308b are composed of alloy of AuGe, Ni and Au. By thermal annealing, these alloy layers reach the InGaAs layer 303 corresponding to a channel.

Between the ohmic electrodes 308a and 308b is formed a recess which reaches an intermediate depth of the InAlAs layer 306. The recess is covered with an InP layer 310a containing no impurities and having a thickness of 10 nm, and the InP layer 310a is covered with an InAlAs layer 312 containing no impurities and having a thickness of 5 nm. A gate electrode 308c is formed on the InAlAs layer 312. The gate electrode 308c has a multi-layered structure including Ti, Pt and Au layers deposited one on another in this order, and has a gate length of 1 μm.

The gate electrode 308c and the InAlAs layer 312 are entirely covered with a protection film 311 composed of SiN and deposited by PECVD.

In the illustrated field effect transistor in accordance with the seventh embodiment, a mutual conductance of 500 mS/mm was obtained as device initial characteristics. In addition, there were also obtained Schottky barrier height of 0.6 eV and a gate inverse breakdown voltage of 7V.

[Eighth Embodiment]

Figure 5B:
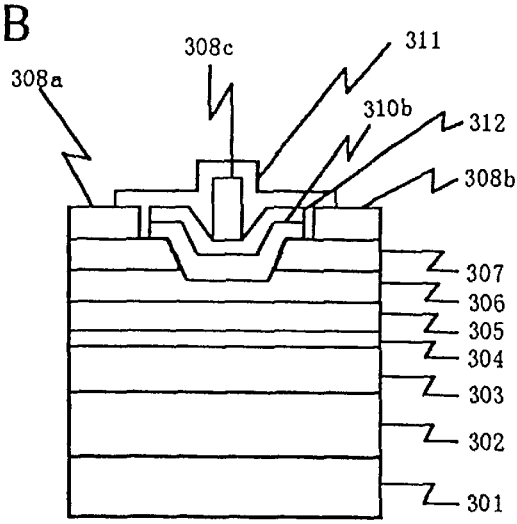
FIG. 5B is a cross-sectional view of a field effect transistor in accordance with the eighth embodiment of the present invention.

FIG. 5B illustrates a field effect transistor in accordance with the eighth embodiment. In the illustrated field effect transistor, an InGaP layer 310b containing no impurities is formed in place of the InP layer 310a in the seventh embodiment, illustrated in FIG. 5A. The field effect transistor in accordance with the eighth embodiment provides the same advantages as those of the field effect transistor in accordance with the seventh embodiment.

In the illustrated field effect transistor in accordance with the eighth embodiment, a mutual conductance of 450 mS/mm was obtained as device initial characteristics. In addition, there were also obtained Schottky barrier height of 0.6 eV and a gate inverse breakdown voltage of 6V.

[Ninth Embodiment]

Figure 5C:
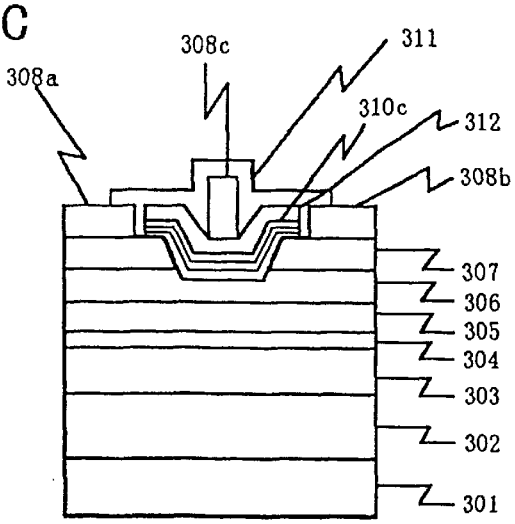
FIG. 5C is a cross-sectional view of a field effect transistor in accordance with the ninth embodiment of the present invention.

FIG. 5C illustrates a field effect transistor in accordance with the ninth embodiment. In the illustrated field effect transistor, a superlattice layer 310c composed of AlAs and InAs and containing no impurities is formed in place of the InP layer 310a in the seventh embodiment, illustrated in FIG. 5A. The superlattice layer 310c has a four-cycled multi-layered structure including four AlAs atom layers and four InAs atom layers deposited one on another. The field effect transistor in accordance with the ninth embodiment provides the same advantages as those of the field effect transistor in accordance with the seventh embodiment.

In the illustrated field effect transistor in accordance with the ninth embodiment, a mutual conductance of 480 mS/mm was obtained as device initial characteristics. In addition, there were also obtained Schottky barrier height of 0.6 eV and a gate inverse breakdown voltage of 7V.

Figure 6A:
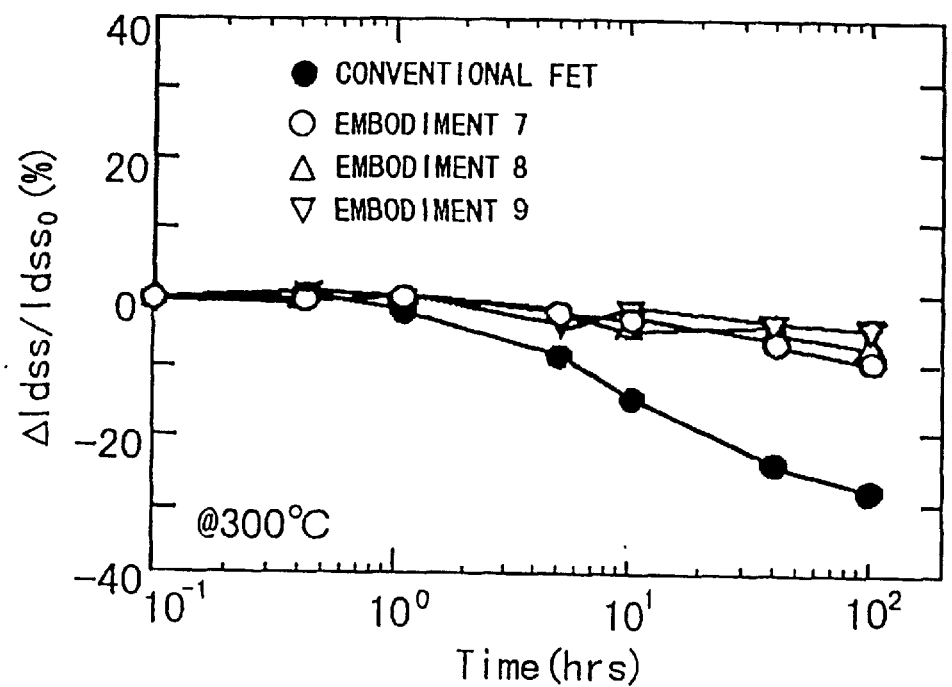
FIG. 6A is a graph showing thermal fluctuation in a drain current in a storage test in heated condition in field effect transistors in accordance with the seventh, eighth and ninth embodiments.
Figure 6B:
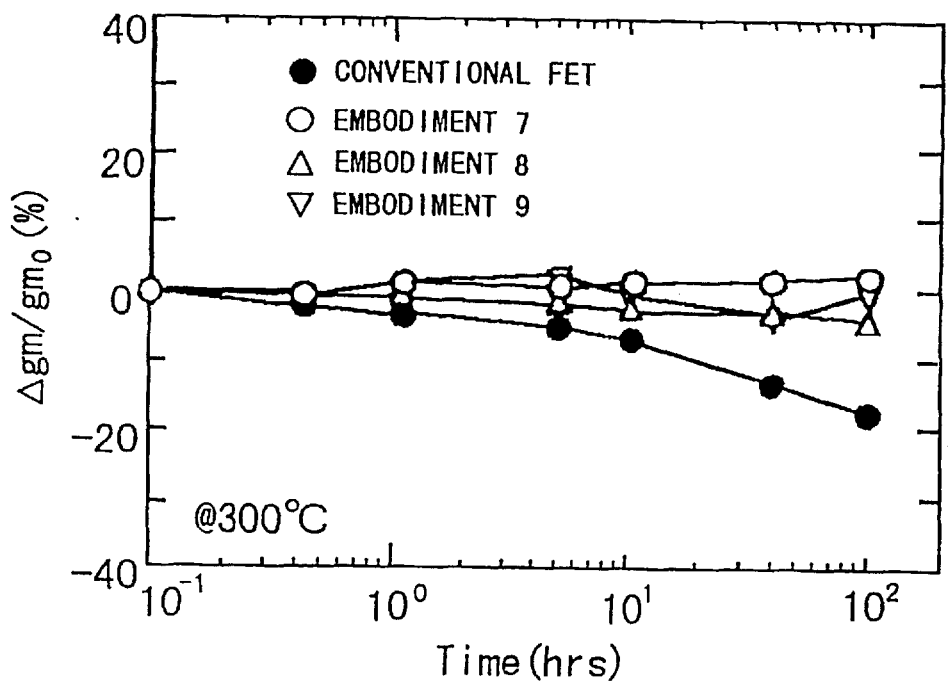
FIG. 6B is a graph showing thermal fluctuation in a mutual conductance in a storage test in heated condition in field effect transistors in accordance with the seventh, eighth and ninth embodiments.

FIGS. 6A and 6B show a drain current and a mutual conductance both obtained when a storage test in heated condition was conducted to the field effect transistors in accordance with the above-mentioned seventh to ninth embodiments, respectively. As mentioned later in detail, the field effect transistors in accordance with the above-mentioned seventh to ninth embodiments show less degradation both in a drain current and a mutual conductance than a conventional field effect transistor represented with solid circles (●).

[Tenth Embodiment]

Figure 7A:
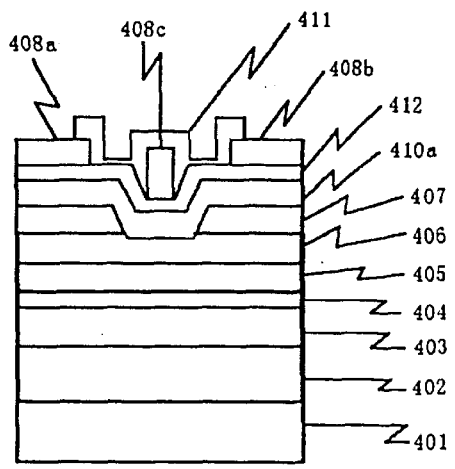
FIG. 7A is a cross-sectional view of a field effect transistor in accordance with the tenth embodiment of the present invention.

FIG. 7A illustrates a field effect transistor in accordance with the tenth embodiment of the present invention. The illustrated field effect transistor includes a semi-insulating InP substrate 401, and an epitaxial-layered structure formed on the InP substrate 401. The epitaxial-layered structure is comprised of an InAlAs layer 402 containing no impurities therein and having a thickness of 500 nm, an InGaAs layer 403 containing no impurities therein and having a thickness of 20 nm, an InAlAs layer 404 containing no impurities therein and having a thickness of 5 nm, an InAlAs layer 405 implanted at a dose of $3\times10^{18}$ cm$^{-3}$ silicon and having a thickness of 150 nm, an InAlAs layer 406 containing no impurities therein and having a thickness of 20 nm, and an InGaAs layer 407 implanted at a dose of $3\times10^{18}$ cm$^{-3}$ silicon and having a thickness of 20 nm, all of which are deposited one on another in this order.

The epitaxial-layered structure is formed at an upper surface thereof with a recess which reaches an intermediate depth of the InAlAs layer 406. The recess is covered with an InP layer 410a containing no impurities and having a thickness of 10 nm, and the InP layer 410a is covered with an InAlAs layer 412 containing no impurities and having a thickness of 5 nm.

A gate electrode 408c is formed on the InAlAs layer 412. The gate electrode 408c has a multi-layered structure including Ti, Pt and Au layers deposited one on another in this order, and has a gate length of 1 μm.

Ohmic electrodes 408a and 408b as source and drain electrodes are formed on the InAlAs layer 412. The ohmic electrodes 408a and 408b are composed of alloy of AuGe, Ni and Au. By thermal annealing, these alloy layers reach the InGaAs layer 403 corresponding to a channel.

The gate electrode 408c and the InAlAs layer 412 are entirely covered with a protection film 411 composed of SiN and deposited by PECVD.

In the illustrated field effect transistor in accordance with the tenth embodiment, a mutual conductance of 500 mS/mm was obtained as device initial characteristics. In addition, there were also obtained Schottky barrier height of 0.6 eV and a gate inverse breakdown voltage of 7V.

Figure 7B:
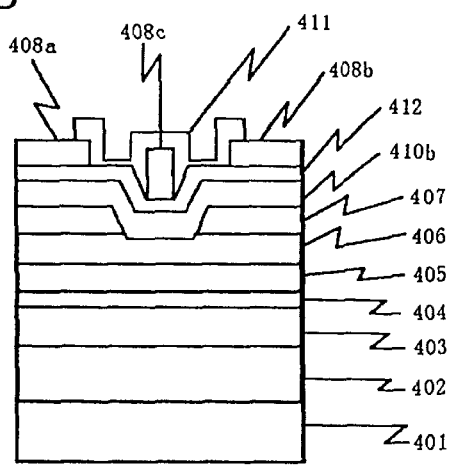
FIG. 7B is a cross-sectional view of a field effect transistor in accordance with the eleventh embodiment of the present invention.

[Eleventh Embodiment]FIG. 7B illustrates a field effect transistor in accordance with the eleventh embodiment. In the illustrated field effect transistor, an InGaP layer 410b containing no impurities is formed in place of the InP layer 410a in the tenth embodiment, illustrated in FIG. 7A. The field effect transistor in accordance with the eleventh embodiment provides the same advantages as those of the field effect transistor in accordance with the tenth embodiment.

In the illustrated field effect transistor in accordance with the eleventh embodiment, a mutual conductance of 500 mS/mm was obtained as device initial characteristics. In addition, there were also obtained Schottky barrier height of 0.55 eV and a gate inverse breakdown voltage of 6V.

Figure 7C:
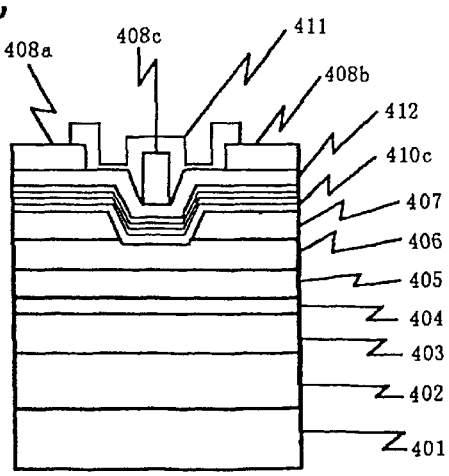
FIG. 7C is a cross-sectional view of a field effect transistor in accordance with the twelfth embodiment of the present invention.

[Twelfth Embodiment]FIG. 7C illustrates a field effect transistor in accordance with the twelfth embodiment. In the illustrated field effect transistor, a superlattice layer 410c composed of AlAs and InAs and containing no impurities is formed in place of the InP layer 410a in the tenth embodiment, illustrated in FIG. 7A. The superlattice layer 410c has a four-cycled multi-layered structure including four AlAs atom layers and four InAs atom layers deposited one on another. The field effect transistor in accordance with the twelfth embodiment provides the same advantages as those of the field effect transistor in accordance with the tenth embodiment.

In the illustrated field effect transistor in accordance with the twelfth embodiment, a mutual conductance of 520 mS/mm was obtained as device initial characteristics. In addition, there were also obtained Schottky barrier height of 0.5 eV and a gate inverse breakdown voltage of 5V.

Figure 8A:
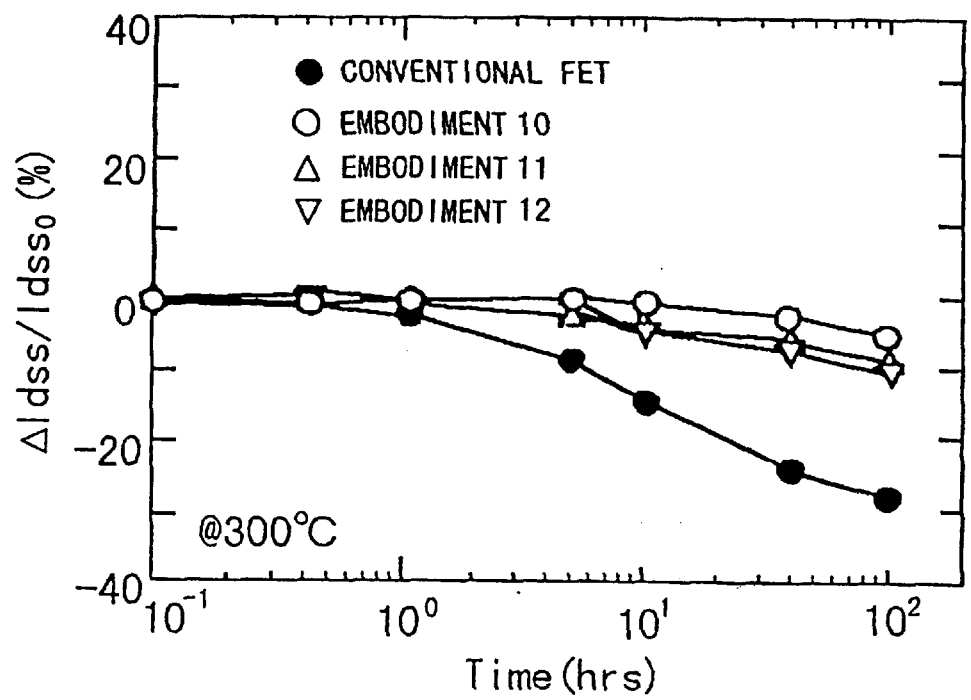
FIG. 8A is a graph showing thermal fluctuation in a drain current in a storage test in heated condition in field effect transistors in accordance with the tenth, eleventh and twelfth embodiments.
Figure 8B:
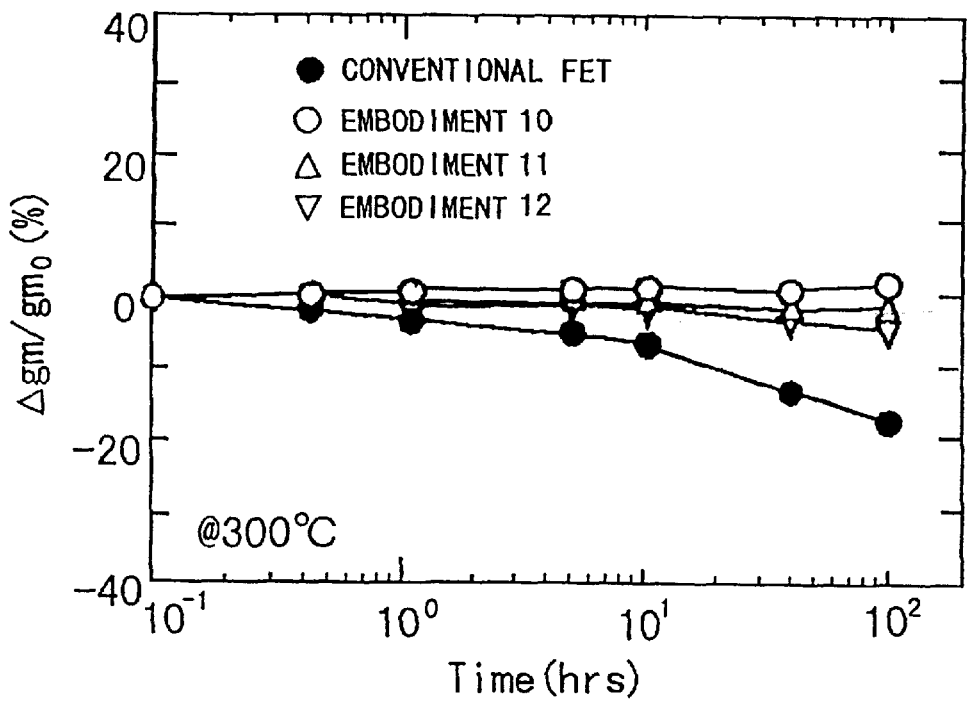
FIG. 8B is a graph showing thermal fluctuation in a mutual conductance in a storage test in heated condition in field effect transistors in accordance with the tenth, eleventh and twelfth embodiments.

FIGS. 8A and 8B show a drain current and a mutual conductance both obtained when a storage test in heated condition was conducted to the field effect transistors in accordance with the above-mentioned tenth to twelfth embodiments, respectively. As mentioned later in detail, the field effect transistors in accordance with the above-mentioned tenth to twelfth embodiments show less degradation both in a drain current and a mutual conductance than a conventional field effect transistor represented with solid circles (●).

[Comparison between the Invention and Prior Art]

Figure 9:
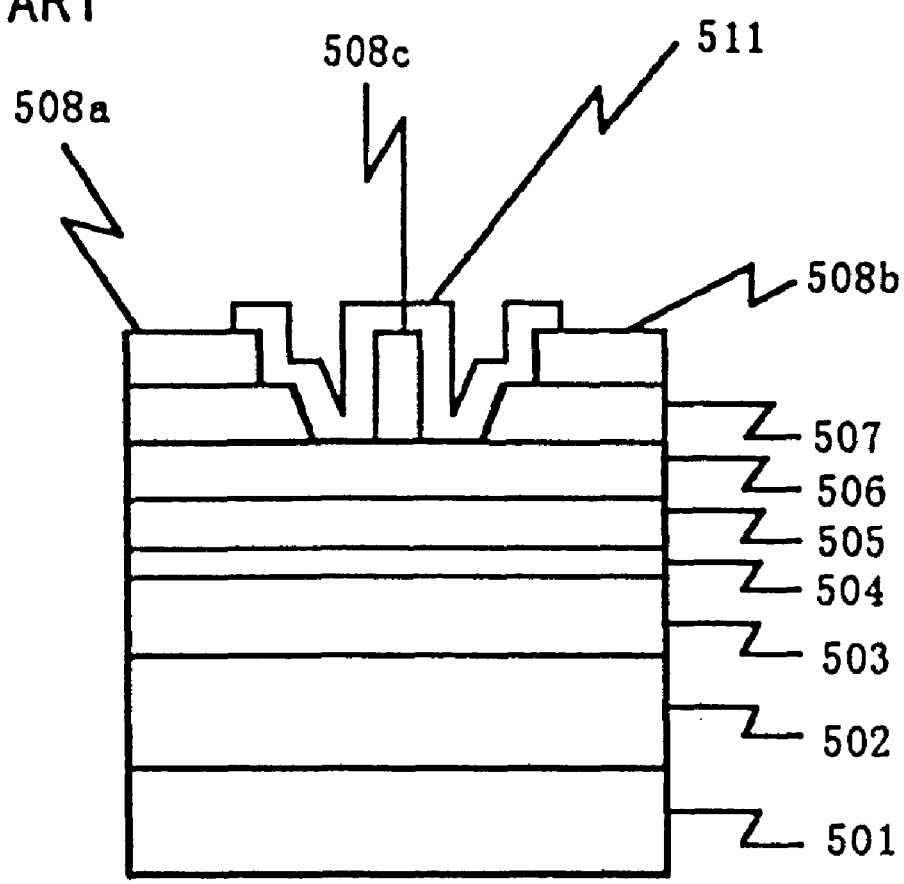
FIG. 9 is a cross-sectional view of a conventional field effect transistor.

FIG. 9 illustrates a conventional field effect transistor including an InAlAs donor layer. The illustrated conventional field effect transistor includes a semi-insulating InP substrate 501, and an epitaxial-layered structure formed on the InP substrate 501. The epitaxial-layered structure is comprised of an InAlAs layer 502 containing no impurities therein, an InGaAs layer 503 containing no impurities therein, an InAlAs layer 504 containing no impurities therein, an InAlAs layer 505 containing impurities such as silicon therein, an InAlAs layer 506 containing no impurities, and an InGaAs layer 507 containing impurities such as silicon therein, all of which are deposited one on another in this order.

Source and drain electrodes 508a and 508b are formed on the uppermost layer or InGaAs layer 507. The InGaAs layer 507 is formed with a recess between the source and drain electrodes 508a and 508b. A gate electrode 508c is formed on the InAlAs layer 506 within the recess of the InGaAs layer 507.

The gate electrode 508c and the recess are entirely covered with a rotection film 511 composed of SiN and deposited by PECVD.

The inventor conducted the experiment where the field effect transistors in accordance with the first to twelfth embodiments and the conventional field effect transistor illustrated in FIG. 9 were kept heated in a furnace at 300° C. FIGS. 2A, 4A, 6A, and 8A illustrate fluctuation in a drain current with the lapse of time in the experiment in the field effect transistors in accordance with the first to twelfth embodiments, and FIGS. 2B, 4B, 6B and 8B illustrate fluctuation in a mutual conductance with the lapse of time in the experiment in those field effect transistors.

In the conventional field effect transistor, both a drain current and a mutual conductance were gradually degraded with the lapse of time. After 100 hours had passed, a drain current was degraded by 25% or greater relative to the initial drain current, and a mutual conductance was degraded by 15% or greater relative to the initial mutual conductance.

On the other hands, in the field effect transistors in accordance with the first to twelfth embodiments, even after 100 hours had passed, a drain current was degraded by 10% or less relative to the initial drain current, and a mutual conductance was degraded by 5% or less relative to the initial mutual conductance. Thus, it was confirmed that the field effect transistors in accordance with the embodiments provided superior thermal stability.

In addition, SIMS analysis was conducted to the field effect transistors having been kept heated for 100 hours to thereby examine whether impurities entered the field effect transistors. It was confirmed that impurities, that is, foreign materials other than constituents of the field effect transistor, did not exist in the transistors, and that there was no fluctuation in profiles of constituents of the transistors.

Apart from the field effect transistors in accordance with the third, sixth and ninth embodiments illustrated in FIGS. 1C, 3C and 5C, respectively, in which the superlattice composed of AlAs and InAs is employed, the inventor had fabricated field effect transistors including an $Al_XGa_{1-X}As$ ($0 \leq X \leq 1$) layer, an $In_XGa_{1-X}As$ ($0 \leq X \leq 1$) layer, and an $In_XAl_{1-X}As$ ($0 \leq X < 0.4$ or $0.6 < X \leq 1$) in place of the above-mentioned superlattice, and tested them. When those layers had a thickness of 3 nm, the same thermal stability was obtained as thermal stability which would be obtained when the superlattice is used.

Though the above-mentioned embodiments employ specific material and dimensions, it is for ease of understanding the invention. For instance, thickness of the layers in the crystal structure and doping concentration may be varied from those shown in the embodiments. It should be noted that the field effect transistor in accordance with the present invention may be advantageously designed to have an InAlAs donor layer into which silicon or other impurities is(are) planar-doped. Any material other than silicon may be employed as donor impurity unless it enables n-type doping. For instance, sulfur (S) and selenium (Se) may be employed in place of silicon.

In the above-mentioned embodiments, the ohmic electrodes are composed of alloy of AuGe, Ni and Au, however, it should be noted that the ohmic electrodes might be composed of non-alloy metal such as Ti, Pt or Au. The gate electrode may be composed of a single metal layer or deposited metal layers such as WSi, W, Ti/Al, Pt/Ti/Pt/Au, Al, or Mo/Ti/Pt/Au.

In the superlattice composed of AlAs and InAs, employed in the field effect transistors in accordance with the third, sixth and ninth embodiments, the number of atomic layers and the number of cycles of superlattice are not to be limited to the numbers exemplified in those embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-22989 filed on Feb. 5, 1997 including specification, claims, drawings and summary is incorporated herein by reference in its entirety.

What is claimed is:

1. A field effect transistor comprising:
   a semi-insulating semiconductor substrate;
   an epitaxial, layered structure on said substrate and having a recess therein at a region in which a gate is to be formed, said layered structure comprising an impurity doped top layer and an undoped layer directly beneath said top layer, said recess extending completely through said top layer and into, but not through, said undoped layer;
   a gate base layer formed directly on portions of said top layer and said undoped layer exposed in said recess, said gate base layer comprising an $In_XAl_{1-X}As$ ($0 \leq X < 0.4$ or $0.6 < X \leq 1$) layer; and
   a gate electrode formed on said gate base layer.

2. The field effect transistor as set forth in claim 1, further comprising an InAlAs layer containing no impurities therein, formed between said gate base layer and said gate electrode.

3. The field effect transistor as set forth in claim 1, further comprising an AlGaAs layer containing no impurities therein, formed between said gate base layer and said gate electrode.

4. The field effect transistor as set forth in claim 1, wherein said semi-insulating semiconductor substrate is composed of InP.

5. The field effect transistor as set forth in claim 1, wherein a portion of said gate base layer extends beyond a periphery of said recess and is directly on a top surface of said top layer adjacent to said recess.

6. The field effect transistor as set forth in claim 5, further comprising source and drain electrodes that are directly on the top surface of said top layer and separated from said portion of said gate base layer that is directly on the top surface.

7. A field effect transistor comprising:
   a semi-insulating semiconductor substrate;
   an epitaxial, layered structure on said substrate and having a recess therein at a region in which a gate is to be formed, said layered structure comprising an impurity doped top layer and an undoped layer directly beneath said top layer, said recess extending completely through said top layer and into, but not through, said undoped layer;
   a gate base layer formed directly on portions of said top layer and said undoped layer exposed in said recess, said gate base layer comprising a plurality of layers including an $In_XAl_{1-X}As$ ($0 \leq X < 0.4$ or $0.6 < X \leq 1$) layer; and
   a gate electrode formed on said gate base layer, wherein a portion of said gate base layer extends beyond a periphery of said recess and is directly on a top surface of said top layer adjacent to said recess.

8. The field effect transistor as set forth in claim 7, further comprising source and drain electrodes that are directly on the top surface of said top layer and separated from said portion of said gate base layer that is directly on the top surface.

9. The field effect transistor as set forth in claim 7, further comprising an InAlAs layer containing no impurities therein, formed between said gate base layer and said gate electrode.

10. The field effect transistor as set forth in claim 7, further comprising an AlGaAs layer containing no impurities therein, formed between said gate base layer and said gate electrode.

11. The field effect transistor as set forth in claim 7, wherein said semi-insulating semiconductor substrate is composed of InP.

12. A field effect transistor comprising:
    a semi-insulating semiconductor substrate;
    an epitaxial, layered structure on said substrate and having a recess therein at a region in which a gate is to be formed, said layered structure comprising an impurity doped top layer and an undoped layer directly beneath said top layer, said recess extending completely through said top layer and into, but not through, said undoped layer;
    a gate base layer formed directly on portions of said top layer and said undoped layer exposed in said recess, said gate base layer comprising one of a plurality of layers including an $In_XAl_{1-X}As$ ($0 \leq X < 0.4$ or $0.6 < X \leq 1$) layer; and
    a gate electrode formed on said gate base layer.

13. The field effect transistor as set forth in claim 12, further comprising an InAlAs layer containing no impurities therein, formed between said gate base layer and said gate electrode.

14. The field effect transistor as set forth in claim 12, further comprising an AlGaAs layer containing no impurities therein, formed between said gate base layer and said gate electrode.

15. The field effect transistor as set forth in claim 12, wherein said semi-insulating semiconductor substrate is composed of InP.

* * * * *